(12) United States Patent
Peng et al.

(10) Patent No.: US 8,482,933 B2
(45) Date of Patent: Jul. 9, 2013

(54) HOLDING APPARATUS FOR UPRIGHT PLUG-IN ELEMENT

(75) Inventors: Wen-Tang Peng, Taipei-Hsien (TW); Zhe Zhang, Shenzhen (CN); Tie-Shan Jiang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 260 days.

(21) Appl. No.: 12/954,553

(22) Filed: Nov. 24, 2010

(65) Prior Publication Data

US 2012/0113612 A1 May 10, 2012

(30) Foreign Application Priority Data

Nov. 10, 2010 (CN) .......................... 2010 1 0538714

(51) Int. Cl.
*H05K 7/02* (2006.01)
(52) U.S. Cl.
USPC ......................................................... 361/809

(58) Field of Classification Search
USPC .................... 361/809, 788, 796; 439/78, 353, 439/369, 483, 680
See application file for complete search history.

(56) References Cited

U.S. PATENT DOCUMENTS 8,052,455 B1 * 11/2011 Peng et al. ..................... 439/353

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

A holding apparatus includes a receiving element and an elastic element. The receiving element is fixed on a circuit board and receives an upright plug-in element. The receiving element defines two through holes in two sides of the receiving element. The through holes have different axial lines. The elastic element includes a main pole and two branch poles respectively perpendicularly extending down from two ends of the main pole. Two opposite pins respectively extend from distal ends of the branch poles. The pins of the elastic element are respectively inserted in the through holes of the receiving element, to locate the upright plug-in element between the elastic element and the receiving element.

6 Claims, 5 Drawing Sheets

HOLDING APPARATUS FOR UPRIGHT PLUG-IN ELEMENT

BACKGROUND

1. Technical Field

The present disclosure relates to a holding apparatus used to hold an upright plug-in element inserted in a corresponding port of a circuit board.

2. Description of Related Art

Circuit boards are main parts of electronic devices, such as a motherboard in a computer. The motherboard includes many elements mounted on the motherboard, such as surface mount components and upright plug-in elements. The upright plug-in elements, such as universal serial bus flash disks, are poorly supported and may be easily damaged even from a glancing blow or applied pressure, such as might occur during maintenance of the motherboard.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
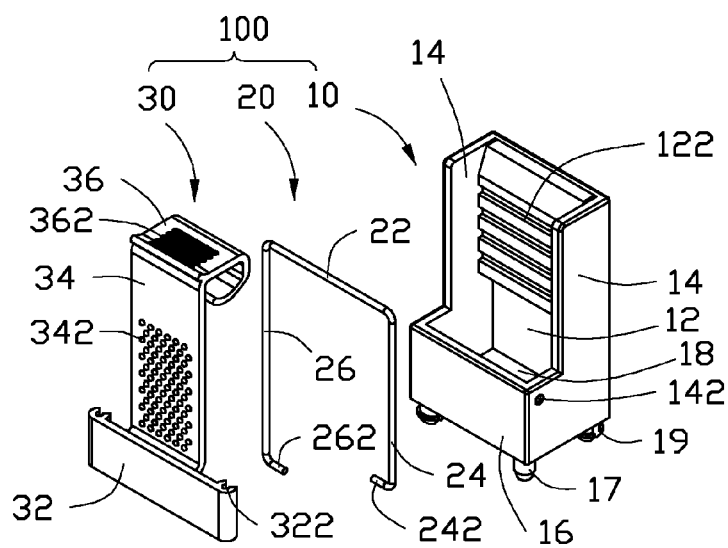
FIG. 1 is an exploded, isometric view of an embodiment of a holding apparatus, together with a motherboard.
Figure 1:
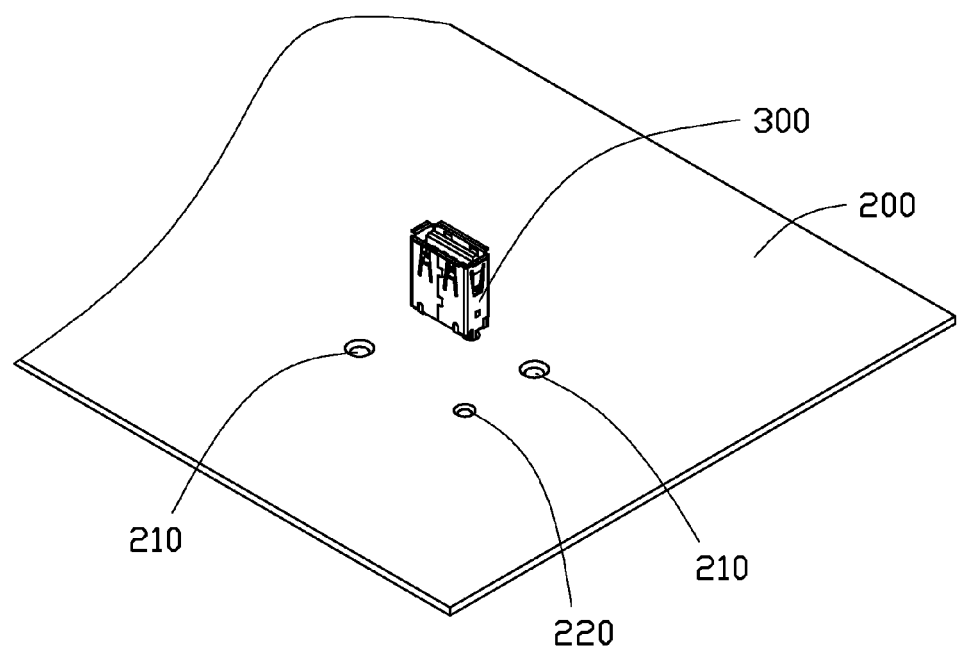
Figure 2:
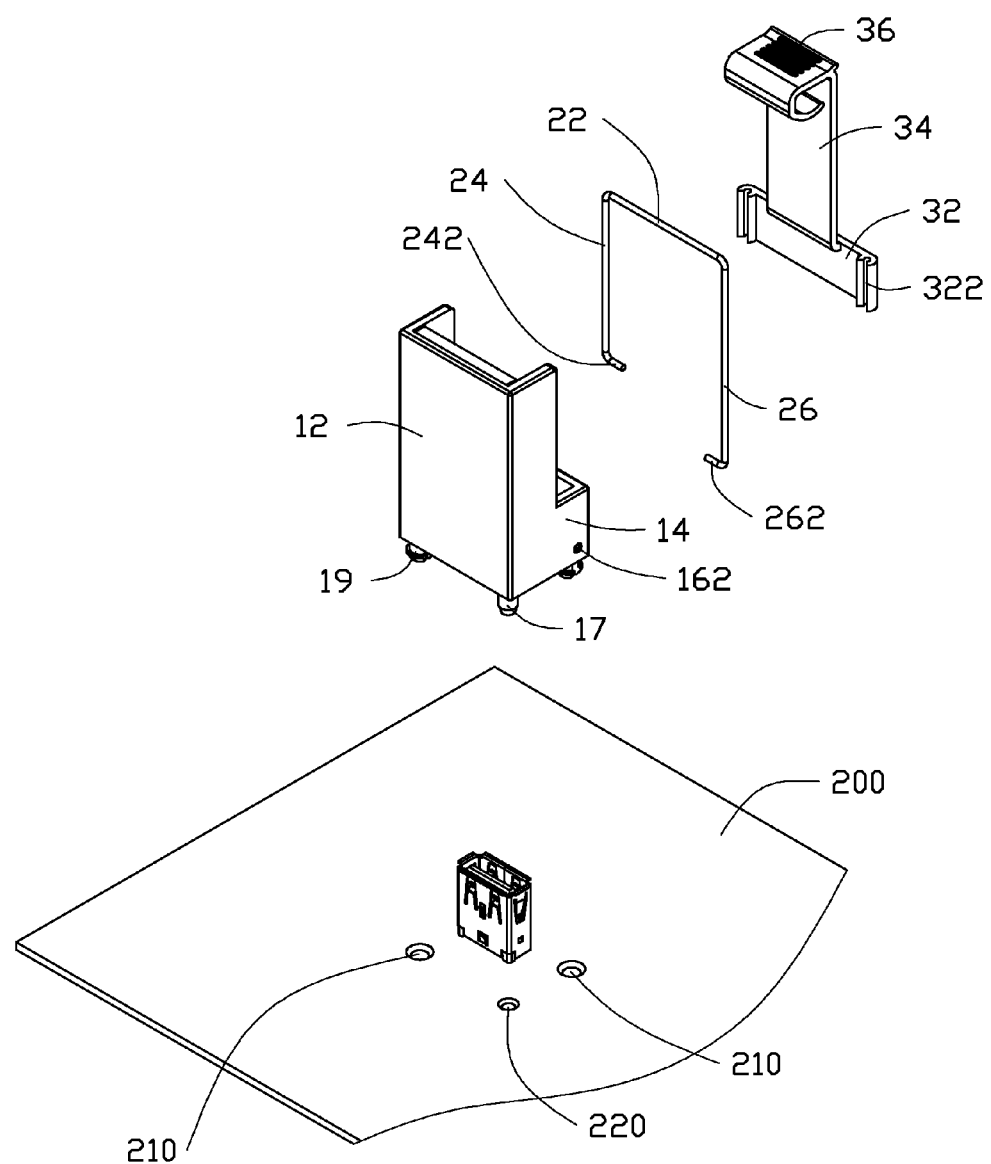
FIG. 2 is similar to FIG. 1, but viewed from another perspective.

Referring to FIGS. 1 and 2, an embodiment of a holding apparatus 100 is used to hold an upright plug-in element, such as a universal serial bus (USB) flash disk 400 (see FIG. 4) inserted in a USB port 300 of a motherboard 200. The holding apparatus 100 includes a receiving element 10, an elastic element 20, and a block 30. In one embodiment, the receiving element 10 and the block 30 are made of plastic.

The receiving element 10 includes a back board 12, two substantially L-shaped side boards 14 substantially perpendicularly extending from opposite sides of the back board 12, and a front board 16 substantially perpendicularly connected between the side boards 14 opposite to the back board 12. A height of the front board 16 is substantially equal to a height of the USB port 300. A height of the back board 12 is less then a height of the USB flash disk 400 after the USB flash disk 400 is inserted in the USB port 300. The back board 12, the side boards 14, and the front board 16 bound an opening 18 in a bottom of the receiving element 10. The back board 12 further includes a stop portion 122 extending from an upper portion of the back board 12, toward the front board 16. One of the side boards 14 defines a first through hole 142 in an upper portion of the side board 14, adjacent the front board 16. The other side board 14 defines a second through hole 162 in a lower portion of the side board 14, adjacent the front board 16. The first through hole 142 and the second through hole 162 have different axial lines. Two positioning poles 17 extend diagonally down from two of four corners of the bottom of the receiving element 10, and two clip poles 19 extend diagonally down from the other two of the four corners of the bottom of the receiving element 10. The motherboard 200 defines two positioning holes 220 corresponding to the positioning poles 17 of the receiving element 10, and defines two fixing holes 210 corresponding to the clip poles 19 of the receiving element 10.

The elastic element 20 is an elastic substantially U-shaped metal wire, and includes a main pole 22, and a first branch pole 24 and a second branch pole 26 substantially perpendicularly extending down from opposite ends of the main pole 22. A length of the first branch pole 24 is less than a length of the second branch pole 26. A first pin 242 substantially perpendicularly extends from a distal end of the first branch pole 24 towards the second branch pole 26. A second pin 262 substantially perpendicularly extends from a distal end of the second branch pole 26 towards the first branch pole 24. The first pin 242 and the second pin 262 can be respectively inserted into the first through hole 142 and the second through hole 162 of the receiving element 10.

The block 30 includes a substantially rectangular slidable board 32. Two elastic clip portions 322 extend from opposite ends of the slidable board 32, and respectively clip onto the first branch pole 24 and the second branch pole 26. A substantially L-shaped blocking board 34 extends up from a middle of an upper portion of a side of the slidable board 32. A plurality of salients 342 protrudes from the board 34, facing the slidable board 32. An operation portion 36 substantially perpendicularly extends from a top of the board 34, away from the slidable board 32. A plurality of skidproof strips 362 protrudes from a top of the operation portion 36. In other embodiments, the block 30 can be omitted to save costs.

Figure 3:
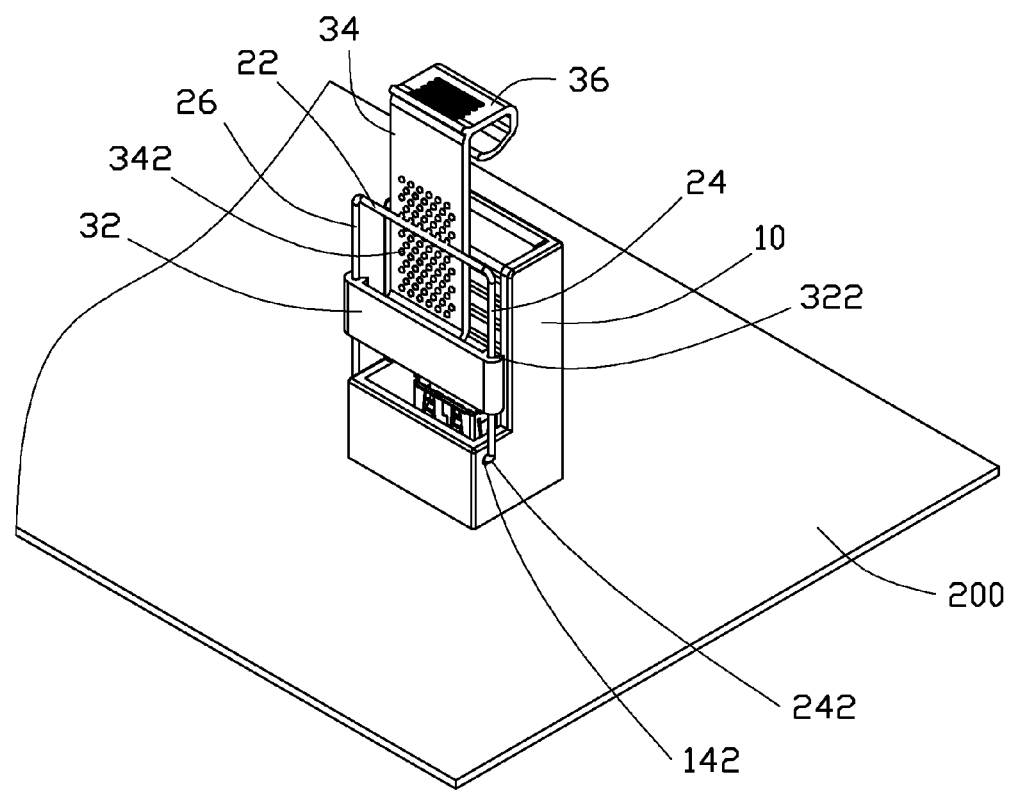
FIG. 3 is an assembled, isometric view of FIG. 1.

Referring to FIG. 3, in assembly, the receiving element 10 is fixed on the motherboard 200 by the positioning poles 17 being inserted in the positioning holes 220 and the clip poles 19 being inserted in the fixing holes 210, with the USB port 300 positioned in the receiving element 10 through the opening 18. The first pin 242 and the second pin 262 of the elastic element 20 are respectively inserted into the first through hole 142 and the second through hole 162 of the receiving element 10. The clip portions 322 of the slidable board 32 respectively slidingly clip onto the first branch pole 24 and the second branch pole 26 of the elastic element 20, and the main pole 22 is blocked by the salients 342.

Figure 4:
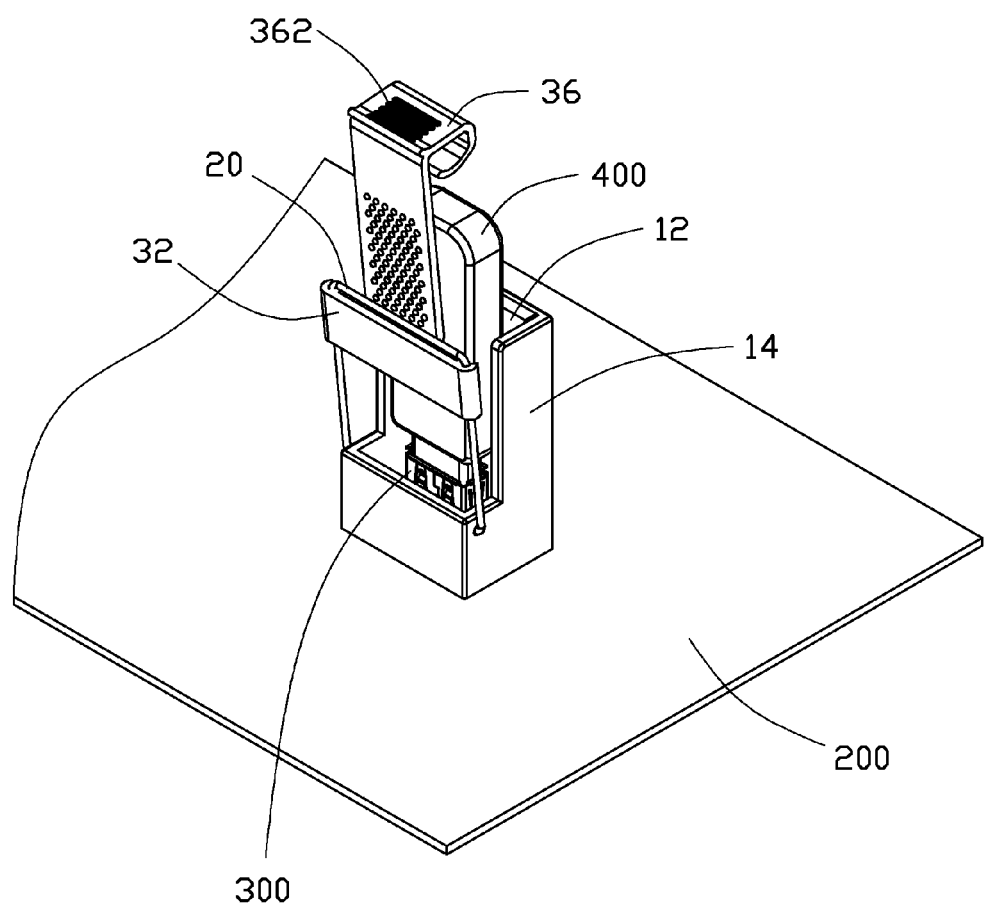
FIG. 4 is similar to FIG. 3, but showing a universal serial bus flash disk mounted in the holding apparatus.
Figure 5:
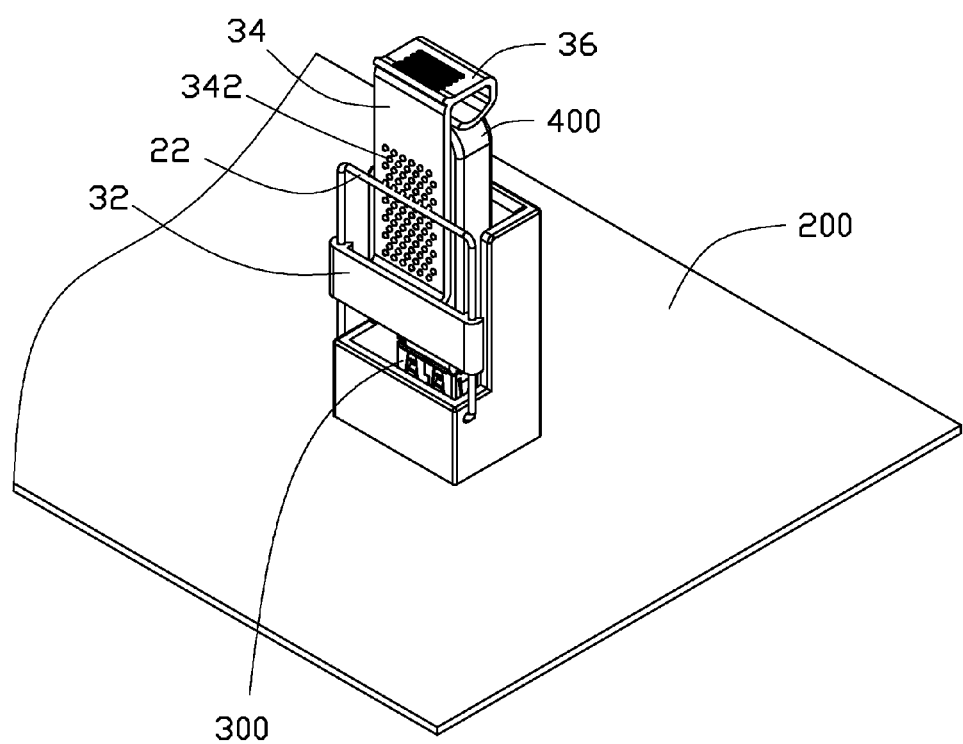
FIG. 5 is similar to FIG. 4, but showing another state.

Referring to FIGS. 4 and 5, in use, the clip portions 322 are slid to tops of the first branch pole 24 and the second branch pole 26. The elastic element 20 is deformed, with the main pole 22 moving a predetermined distance away from the back board 12, therefore the USB flash disk 40 can be placed between the back board 12 and the board 34 of the block 30 to be inserted in the USB port 300. The main pole 22 is restored, and the block 30 is slid down along the first and second branch poles 24 and 26 by pushing the operation portion 36, until a bottom of the operation portion 36 contacts a top of the USB flash disk 400. Therefore the USB flash disk 400 is sandwiched between the stop portion 122 and the board 34, which provides support to the USB flash disk 400 and can prevent accidental damaging contact to the disk 400.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An assembly comprising:
   a circuit board comprising a first connector extending up from the circuit board;
   a receiving element fixed on the circuit board, and defining an opening in a bottom of the receiving element through which the first connector extends into the receiving element, the receiving element comprising a back board;
   an elastic element mounted to the receiving element opposite to the back board; and
   a block mounted to the elastic element and slidable along the elastic element up and down, the block comprising an operation portion extending from a top of the block;
   wherein the block is operable to be moved away from the back board by deforming the elastic element, thereby allowing a second connector to be inserted in the receiving element to engage with the first connector; when the elastic element moves back, the operation portion resists against a top surface of the second connector by sliding the block down, and the second connector is located between the block and the back board.

2. The assembly of claim 1, wherein block comprises a blocking board opposite the back board of the receiving element, to sandwich the second connector together with the back board.

3. The assembly of claim 1, wherein the elastic element is made by an elastic wire, and comprises a horizontal main pole and two branch poles extending down from opposite ends of the main pole, low ends of the branch poles are fixed to the receiving element, with the main pole opposite to the back board of the receiving element.

4. The assembly of claim 3, wherein the block comprises a slidable board slidably mounted to the branch poles of the elastic element up and down, and a blocking board extending up from the slidable board, the blocking board and the back board of the receiving element sandwich the second connector therebetween.

5. The assembly of claim 3, wherein the receiving element further comprises two side boards substantially extending from opposite sides of the back board, the first connector and second connector are located among the back board and the side boards, each side board defines a through hole, a pin extends from a low end of each branch pole of the elastic element, to fixedly engage in a corresponding one of the through holes of the side boards.

6. The assembly of claim 5, wherein the through holes of the receiving element have different height axial lines, the branch poles of the elastic element have different lengths.

\* \* \* \* \*